United States Patent
Benvegnu et al.

(10) Patent No.: US 9,607,910 B2
(45) Date of Patent: Mar. 28, 2017

(54) LIMITING ADJUSTMENT OF POLISHING RATES DURING SUBSTRATE POLISHING

(71) Applicant: Applied Materials, Inc., Santa Clara, CA (US)

(72) Inventors: Dominic J. Benvegnu, La Honda, CA (US); Benjamin Cherian, San Jose, CA (US); Sivakumar Dhandapani, San Jose, CA (US); Harry Q. Lee, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/257,785

(22) Filed: Sep. 6, 2016

(65) Prior Publication Data

US 2016/0372388 A1 Dec. 22, 2016

Related U.S. Application Data

(62) Division of application No. 14/092,429, filed on Nov. 27, 2013.

(51) Int. Cl.
*H01L 21/00* (2006.01)
*H01L 21/66* (2006.01)

(52) U.S. Cl.
CPC .................. *H01L 22/26* (2013.01)

(58) Field of Classification Search
CPC ..................................... H01L 22/26
USPC ........................................... 438/8
See application file for complete search history.

(56) References Cited

U.S. PATENT DOCUMENTS

| | | |
|---|---|---|
| 6,309,276 B1 | 10/2001 | Tsai et al. |
| 6,361,646 B1 | 3/2002 | Bibby et al. |
| 6,676,482 B2 | 1/2004 | Bibby et al. |
| 7,409,260 B2 | 8/2008 | David et al. |
| 2006/0246820 A1 | 11/2006 | Hofmann |
| 2009/0036026 A1 | 2/2009 | David et al. |
| 2009/0061733 A1 | 3/2009 | Fujita et al. |
| 2010/0056023 A1 | 3/2010 | David et al. |
| 2010/0120330 A1 | 5/2010 | Zhang et al. |
| 2010/0217430 A1 | 8/2010 | David et al. |
| 2011/0256805 A1 | 10/2011 | David et al. |
| 2011/0282477 A1 | 11/2011 | Lee et al. |
| 2012/0231701 A1 | 9/2012 | Qian et al. |
| 2013/0237128 A1 | 9/2013 | David et al. |
| 2013/0280827 A1 | 10/2013 | Benvegnu et al. |
| 2013/0288572 A1 | 10/2013 | Benvegnu et al. |

OTHER PUBLICATIONS

International Search Report and Written Opinion in International Application No. PCT/US2014/065243, mailed Feb. 16, 2015, 11 pages.

*Primary Examiner* — Ajay K Arora
(74) *Attorney, Agent, or Firm* — Fish & Richardson P.C.

(57) ABSTRACT

A method of controlling polishing includes polishing a region of a substrate at a first polishing rate, measuring a sequence of characterizing values for the region of the substrate during polishing with an in-situ monitoring system, determining a polishing rate adjustment for each of a plurality of adjustment times prior to a polishing endpoint time, and adjusting a polishing parameter to polish the substrate at a second polishing rate. The time period is greater than a period between the adjustment times and the projected time is before the polishing endpoint time. The second polishing rate is the first polishing rate as adjusted by the polishing rate adjustment.

16 Claims, 6 Drawing Sheets

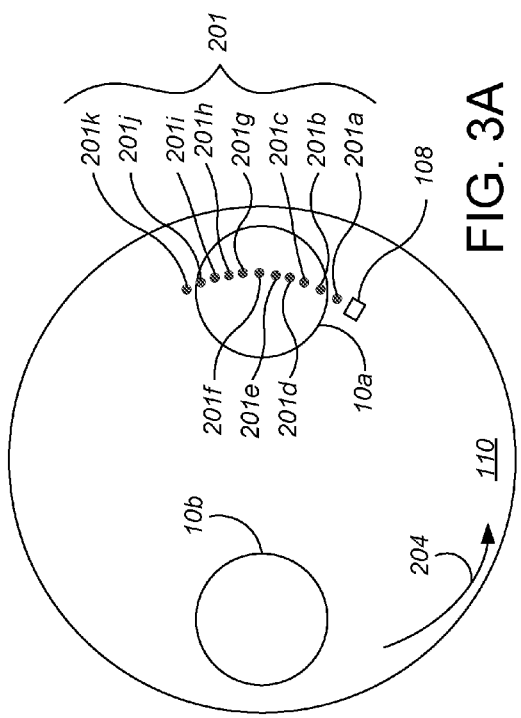
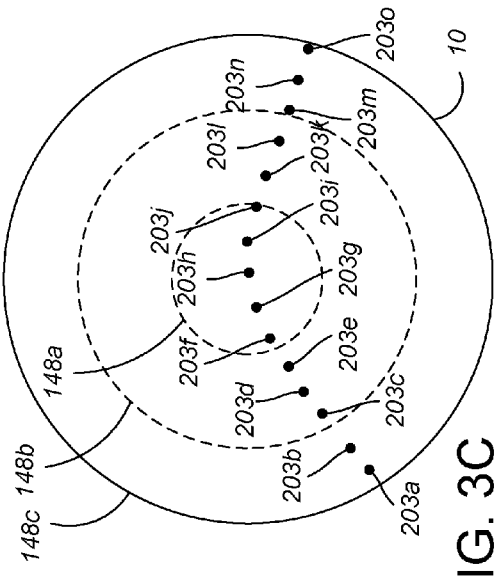
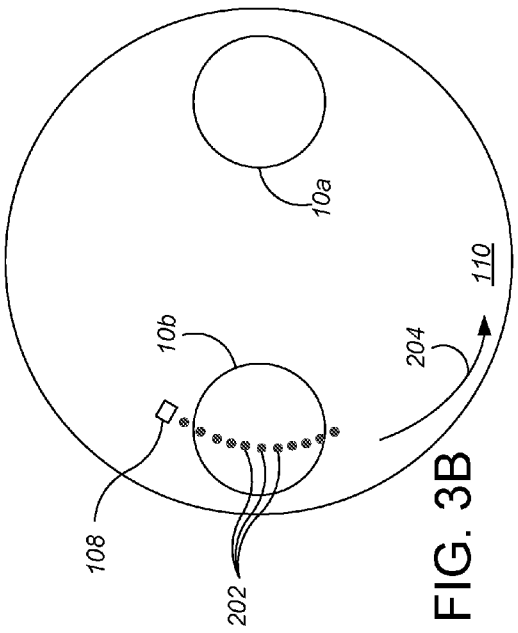

LIMITING ADJUSTMENT OF POLISHING RATES DURING SUBSTRATE POLISHING

CROSS-REFERENCE TO RELATED APPLICATIONS

This application is a divisional of U.S. application Ser. No. 14/092,429, filed on Nov. 27, 2013, which is incorporated by reference.

TECHNICAL FIELD

The present disclosure relates generally to monitoring of multiple zones on a substrate during chemical mechanical polishing.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier head. The exposed surface of the substrate is typically placed against a rotating polishing pad with a durable roughened surface. The carrier head provides a controllable load on the substrate to push it against the polishing pad. A polishing liquid, such as a slurry with abrasive particles, is typically supplied to the surface of the polishing pad.

One problem in CMP is using an appropriate polishing rate to achieve a desirable profile, e.g., a substrate layer that has been planarized to a desired flatness or thickness, or a desired amount of material has been removed. Variations in the initial thickness of a substrate layer, the slurry composition, the polishing pad condition, the relative speed between the polishing pad and a substrate, and the load on a substrate can cause variations in the material removal rate across a substrate, and from substrate to substrate. These variations cause variations in the time needed to reach the polishing endpoint and the amount removed. Therefore, it may not be possible to determine the polishing endpoint merely as a function of the polishing time, or to achieve a desired profile merely by applying a constant pressure.

In some systems, a substrate is optically monitored in-situ during polishing, e.g., through a window in the polishing pad. However, existing optical monitoring techniques may not satisfy increasing demands of semiconductor device manufacturers.

SUMMARY

According to an aspect, a method of controlling polishing includes polishing a region of a substrate at a first polishing rate, measuring a sequence of characterizing values for the region of the substrate during polishing with an in-situ monitoring system, determining a polishing rate adjustment for each of a plurality of adjustment times prior to a polishing endpoint time, and adjusting a polishing parameter to polish the substrate at a second polishing rate. The characterizing values depend on a thickness of a layer undergoing polishing in the region. For each of a plurality of adjustment times prior to a polishing endpoint time, the polishing rate adjustment is determined for the region of the substrate based on the sequence of characterizing values. Determining the polishing rate adjustment includes calculating a desired polishing rate to bring a projected characterizing value to a desired value at a projected time that is a time period after the adjustment time. The polishing rate adjustment is calculated from the first polishing rate and the desired polishing rate. The time period is greater than a period between the adjustment times and the projected time is before the polishing endpoint time. The second polishing rate is the first polishing rate as adjusted by the polishing rate adjustment.

Implementations of the computer program product, the system, and/or the method can include one or more of the following features. Determining the polishing rate adjustment may include calculating a desired polishing rate adjustment from the desired polishing rate and the first polishing rate, and comparing the desired polishing rate adjustment to a threshold. That the desired polishing rate adjustment exceeds the threshold may be determined, and the polishing rate adjustment may be set equal to the threshold. That the desired polishing rate adjustment does not exceeds the threshold may be determined, and the polishing rate adjustment may be set equal to the desired polishing rate adjustment. The desired value may be a projected value for a reference region of the substrate. The plurality of adjustment times may occur at a fixed frequency. The fixed frequency may be once per 5 to 50 rotations of a platen supporting a polishing pad that polishes the substrate. The fixed frequency may be once per 3 to 30 seconds. The time period may be at least twice the period between the adjustment times. A sequence of spectra reflected from the region of the substrate may be measured during polishing with an in-situ monitoring system to provide a sequence of measured spectra, and a characterizing value may be calculated from each measured spectrum from the sequence of measured spectra to generate the sequence of characterizing values.

In other aspects, polishing systems and computer-program products tangibly embodied on a computer readable medium are provided to carry out these methods.

The details of one or more embodiments of the invention are set forth in the accompanying drawings and the description below. Other features, objects, and advantages of the invention are apparent from the description and drawings, and from the claims.

DESCRIPTION OF DRAWINGS

FIG. 2 illustrates a schematic top view of a substrate having multiple zones.

FIG. 3A illustrates a top view of a polishing pad and shows locations where in-situ measurements are taken on a first substrate.

FIG. 3B illustrates a top view of a polishing pad and shows locations where in-situ measurements are taken on a second substrate.

FIG. 3C illustrates a schematic top view of a distribution of multiple locations where in-situ measurements are taken relative to multiple zones of a substrate.

DETAILED DESCRIPTION

Overview

Figure 1:
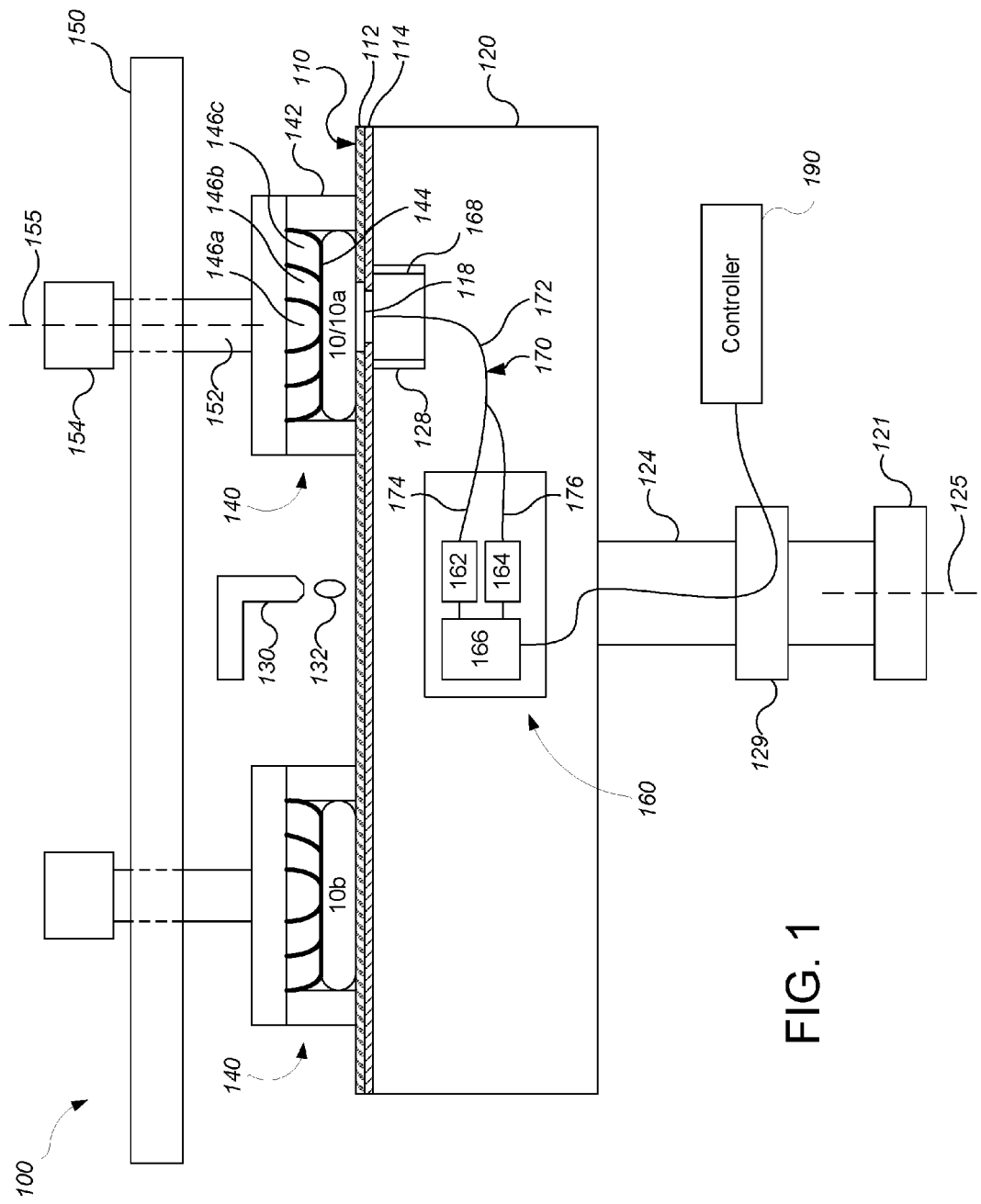
FIG. 1 illustrates a schematic cross-sectional view of an example of a polishing apparatus having two polishing heads.

Where one substrate is being polished or multiple substrates are being polished simultaneously, e.g., on the same polishing pad, polishing rate variations between different regions of the same substrate or between the substrates can lead to the different regions of the same substrate or different substrates reaching their target thickness at different times. On the one hand, the different regions of the substrate may not reach the desired thickness if polishing of the zones is halted simultaneously. On the other hand, halting polishing for different zones at different times can result in defects or lower the throughput of the polishing apparatus.

By determining a polishing rate for each zone for each substrate from in-situ measurements, and based on a desired thickness at a target time in the future, a desired polishing rate for each zone can be determined. The polishing rate(s) for one or more zones can be adjusted to the respective desired polishing rate(s) to facilitate the substrate(s) to achieve closer endpoint conditions. By "closer endpoint conditions," it is meant that the zones of a substrate would reach their target thickness(es) closer to the same time than without such adjustment, or that the zones of the substrates would have closer to their target thickness(es) at an endpoint time than without such adjustment. The target time is generally chosen to be before a projected endpoint time. During the polishing process of one substrate or one group of substrates, the polishing rate(s) for different zones of each substrate can be determined and adjusted repeatedly.

In some implementations, a polishing rate of a substrate zone is adjusted to a desired polishing rate by adjusting a pressure applied by a polishing head to the substrate zone. The pressure adjustment can be determined based on the difference between the desired polishing rate and a current polishing rate determined based on in-situ measurements. In some implementation, calculation of the pressure adjustment for one zone takes into account effects of pressure on other zones on the polishing rate of the one zone, e.g., using a Preston matrix.

An example in-situ measurement includes optical monitoring of the thickness in a substrate zone. Over time, multiple thicknesses, i.e., decreasing thicknesses, of the substrate zone are determined based on optical spectra collected from the substrate zone and a polishing rate can be derived from the multiple thicknesses. Results of the in-situ measurement, including the optical spectra, contain noise data that may affect the precision of the determined thicknesses and polishing rate, and therefore, the precision of the desired polishing rate and the pressure adjustment. Various noise reduction techniques can be applied to improve the precision.

In some implementations, one or more predictive filters are applied to the results of the in-situ measurement to provide filtered thicknesses and polishing rates that can have improved precision over unfiltered thicknesses and polishing rates. An example of the predictive filter is a Kalman filter. Multiple pressure adjustments, and therefore, polishing rate adjustments, can be made for one or more substrate zones and the overall polishing precision for the substrate(s) can be improved. In some implementations, each pressure adjustment is additionally controlled such that the pressure remains within a predetermined pressure range, and/or the pressure adjustment do not exceed a predetermined pressure adjustment range, so that the possible imprecision in the determined pressure adjustment affects the actual pressure adjustment in a limited manner.

Example Polishing System

FIG. 1 illustrates an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be detachably secured to the platen 120, for example, by a layer of adhesive. The polishing pad 110 can be a two-layer polishing pad with an outer polishing layer 112 and a softer backing layer 114.

The polishing apparatus 100 can include a combined slurry/rinse arm 130. During polishing, the arm 130 is operable to dispense a polishing liquid 132, such as a slurry, onto the polishing pad 110. While only one slurry/rinse arm 130 is shown, additional nozzles, such as one or more dedicated slurry arms per carrier head, can be used. The polishing apparatus can also include a polishing pad conditioner to abrade the polishing pad 110 to maintain the polishing pad 110 in a consistent abrasive state.

In this example, the polishing apparatus 100 includes two (or two or more) carrier heads 140, although the discussion in the entire disclosure also applies to a polishing apparatus that includes only one carrier head. Each carrier head 140 is operable to hold a substrate 10 (e.g., a first substrate 10a at one carrier head and a second substrate 10b at the other carrier head) against the polishing pad 110. Each carrier head 140 can have independent control of the polishing parameters, for example pressure, associated with each respective substrate.

In particular, each carrier head 140 can include a retaining ring 142 to retain the substrate 10 below a flexible membrane 144. Each carrier head 140 also includes a plurality of independently controllable pressurizable chambers defined by the membrane, e.g., three chambers 146a-146c, which can apply independently controllable pressures to associated zones 148a-148c on the flexible membrane 144 and thus on the substrate 10 (see FIG. 2).

Referring to FIG. 2, the center zone 148a can be substantially circular, and the remaining zones 148b-148c can be concentric annular zones around the center zone 148a. Although only three chambers/zones are illustrated in FIGS. 1 and 2 for ease of illustration, there could be two chambers/zones, or four or more chambers/zones, e.g., five chambers/zones.

Returning to FIG. 1, each carrier head 140 is suspended from a support structure 150, e.g., a carousel, and is connected by a drive shaft 152 to a carrier head rotation motor 154 so that the carrier head can rotate about an axis 155. Optionally each carrier head 140 can oscillate laterally, e.g., on sliders on the carousel 150; or by rotational oscillation of the carousel itself. In operation, the platen is rotated about its central axis 125, and each carrier head is rotated about its central axis 155 and translated laterally across the top surface of the polishing pad.

While only two carrier heads 140 are shown, more carrier heads can be provided to hold additional substrates so that the surface area of polishing pad 110 may be used efficiently. Thus, the number of carrier head assemblies adapted to hold substrates for a simultaneous polishing process can be based, at least in part, on the surface area of the polishing pad 110.

The polishing apparatus also includes an in-situ monitoring system 160, which can be used to determine whether to adjust a polishing rate or an adjustment for the polishing rate as discussed below. The in-situ monitoring system 160 can include an optical monitoring system, e.g., a spectrographic monitoring system, or an eddy current monitoring system.

In one embodiment, the monitoring system 160 is an optical monitoring system. An optical access through the polishing pad is provided by including an aperture (i.e., a hole that runs through the pad) or a solid window 118. The solid window 118 can be secured to the polishing pad 110, e.g., as a plug that fills an aperture in the polishing pad, e.g., is molded to or adhesively secured to the polishing pad, although in some implementations the solid window can be supported on the platen 120 and project into an aperture in the polishing pad.

The optical monitoring system 160 can include a light source 162, a light detector 164, and circuitry 166 for sending and receiving signals between a remote controller 190, e.g., a computer, and the light source 162 and light detector 164. One or more optical fibers can be used to transmit the light from the light source 162 to the optical access in the polishing pad, and to transmit light reflected from the substrate 10 to the detector 164. For example, a bifurcated optical fiber 170 can be used to transmit the light from the light source 162 to the substrate 10 and back to the detector 164. The bifurcated optical fiber can include a trunk 172 positioned in proximity to the optical access, and two branches 174 and 176 connected to the light source 162 and detector 164, respectively.

In some implementations, the top surface of the platen can include a recess 128 into which is fit an optical head 168 that holds one end of the trunk 172 of the bifurcated fiber. The optical head 168 can include a mechanism to adjust the vertical distance between the top of the trunk 172 and the solid window 118.

The output of the circuitry 166 can be a digital electronic signal that passes through a rotary coupler 129, e.g., a slip ring, in the drive shaft 124 to the controller 190 for the optical monitoring system. Similarly, the light source can be turned on or off in response to control commands in digital electronic signals that pass from the controller 190 through the rotary coupler 129 to the optical monitoring system 160. Alternatively, the circuitry 166 could communicate with the controller 190 by a wireless signal.

The light source 162 can be operable to emit white light. In one implementation, the white light emitted includes light having wavelengths of 200-800 nanometers. A suitable light source is a xenon lamp or a xenon mercury lamp.

The light detector 164 can be a spectrometer. A spectrometer is an optical instrument for measuring intensity of light over a portion of the electromagnetic spectrum. A suitable spectrometer is a grating spectrometer. Typical output for a spectrometer is the intensity of the light as a function of wavelength (or frequency).

As noted above, the light source 162 and light detector 164 can be connected to a computing device, e.g., the controller 190, operable to control their operation and receive their signals. The computing device can include a microprocessor situated near the polishing apparatus, e.g., a programmable computer. With respect to control, the computing device can, for example, synchronize activation of the light source with the rotation of the platen 120.

In some implementations, the light source 162 and detector 164 of the in-situ monitoring system 160 are installed in and rotate with the platen 120. In this case, the motion of the platen will cause the sensor to scan across each substrate. In particular, as the platen 120 rotates, the controller 190 can cause the light source 162 to emit a series of flashes starting just before and ending just after each substrate 10 passes over the optical access. Alternatively, the computing device can cause the light source 162 to emit light continuously starting just before and ending just after each substrate 10 passes over the optical access. In either case, the signal from the detector can be integrated over a sampling period to generate spectra measurements at a sampling frequency.

Example In-Situ Measurements

In operation, the controller 190 can receive, for example, a signal that carries information describing a spectrum of the light received by the light detector for a particular flash of the light source or time frame of the detector. Thus, this spectrum is a spectrum measured in-situ during polishing.

As shown by in FIG. 3A, if the detector is installed in the platen, due to the rotation of the platen (shown by arrow 204), as the window 108 travels below one carrier head (e.g., the carrier head holding the first substrate 10a), the optical monitoring system making spectra measurements at a sampling frequency will cause the spectra measurements to be taken at locations 201 in an arc that traverses the first substrate 10a. For example, each of points 201a-201k represents a location of a spectrum measurement by the monitoring system of the first substrate 10a (the number of points is illustrative; more or fewer measurements can be taken than illustrated, depending on the sampling frequency). As shown, over one rotation of the platen, spectra are obtained from different radii on the substrate 10a. That is, some spectra are obtained from locations closer to the center of the substrate 10a and some are closer to the edge. Similarly, as shown by in FIG. 3B, due to the rotation of the platen, as the window travels below the other carrier head (e.g., the carrier head holding the second substrate 10b) the optical monitoring system making spectra measurements at the sampling frequency will cause the spectra measurements to be taken at locations 202 along an arc that traverses the second substrate 10b.

Thus, for any given rotation of the platen, based on timing and motor encoder information, the controller can determine which substrate, e.g., substrate 10a or 10b, is the source of the measured spectrum. In addition, for any given scan of the optical monitoring system across a substrate, e.g., substrate 10a or 10b, based on timing, motor encoder information, and optical detection of the edge of the substrate and/or retaining ring, the controller 190 can calculate the radial position (relative to the center of the particular substrate 10a or 10b being scanned) for each measured spectrum from the scan. The polishing system can also include a rotary position sensor, e.g., a flange attached to an edge of the platen that will pass through a stationary optical interrupter, to provide additional data for determination of which substrate and the position on the substrate of the measured spectrum. The controller can thus associate the various measured spectra with the zones 148a-148c (see FIG. 2) on the substrates 10a and 10b. In some implementations, the time of measurement of the spectrum can be used as a substitute for the exact calculation of the radial position.

As an example, referring to FIG. 3C, in one rotation of the platen, spectra corresponding to different locations 203a-

203o are collected by the light detector 164. Based on the radial positions of the locations 203a-203o, five spectra collected at locations 203a-203b and 203m-203o are associated with the outer zone 148c; five spectra collected at locations 203c-203e and 203k-203l are associated with the middle zone 148b; and five spectra collected at locations 203f-203j are associated with the inner zone 148a. Although this example shows that each zone is associated with the same number of spectra, the zones may also be associated with different numbers of spectra based on the in-situ measurements. The number of spectra associated with each zone may change from one rotation of the platen to another. Of course, the numbers of locations given above are simply illustrative, as the actual number of spectra associated with each zone will depend at least on the sampling rate, the rotation rate of the platen, and the radial width of each zone.

Without being limited to any particular theory, the spectrum of light reflected from the substrate 10 evolves as polishing progresses (e.g., over multiple rotations of the platen, not during a single sweep across the substrate) due to changes in the thickness of the outermost layer, thus yielding a sequence of time-varying spectra. Moreover, particular spectra are exhibited by particular thicknesses of the layer stack.

For each measured spectrum, the controller 190 can calculate a characterizing value. The characterizing value is typically the thickness of the outer layer, but can be a related characteristic such as thickness removed. In addition, the characterizing value can be a physical property other than thickness, e.g., metal line resistance. In addition, the characterizing value can be a more generic representation of the progress of the substrate through the polishing process, e.g., an index value representing the time or number of platen rotations at which the spectrum would be expected to be observed in a polishing process that follows a predetermined progress.

One technique to calculate a characterizing value is, for each measured spectrum, to identify a matching reference spectrum from a library of reference spectra. Each reference spectrum in the library can have an associated characterizing value, e.g., a thickness value or an index value indicating the time or number of platen rotations at which the reference spectrum is expected to occur. By determining the associated characterizing value for the matching reference spectrum, a characterizing value can be generated. This technique is described in U.S. Patent Publication No. 2010-0217430, which is incorporated by reference.

Another technique is to fit an optical model to the measured spectrum. In particular, a parameter of the optical model is optimized to provide the best fit of the model to the measured spectrum. The parameter value generated for the measured spectrum generates the characterizing value. This technique is described in U.S. Patent Publication No. 2013-0237128, which is incorporated by reference. Possible input parameters of the optical model can include the thickness, index of refraction and/or extinction coefficient of each of the layers, spacing and/or width of a repeating feature on the substrate.

Calculation of a difference between the output spectrum and the measured spectrum can be a sum of absolute differences between the measured spectrum and the output spectrum across the spectra, or a sum of squared differences between the measured spectrum and the reference spectrum. Other techniques for calculating the difference are possible, e.g., a cross-correlation between the measured spectrum and the output spectrum can be calculated.

Another technique is to analyze a characteristic of a spectral feature from the measured spectrum, e.g., a wavelength or width of a peak or valley in the measured spectrum. The wavelength or width value of the feature from the measured spectrum provides the characterizing value. This technique is described in U.S. Patent Publication No. 2011-0256805, which is incorporated by reference.

Another technique is to perform a Fourier transform of the measured spectrum. A position of one of the peaks from the transformed spectrum is measured. The position value generated for measured spectrum generates the characterizing value. This technique is described in U.S. Patent Publication No. 2013-0280827, which is incorporated by reference.

Based on the spectra measured during one rotation of the platen, multiple characterizing values can be derived based on the multiple (e.g., five in the example shown in FIG. 3C) spectra associated with each zone. For simplicity of the discussion below, we assume that the characterizing value is a thickness value (simply referred to as a "thickness" in the discussion below). However, the discussion also applies to other types of characterizing values that depend on the thickness, e.g., an index value representing the time or number of platen rotations at which the spectrum would be expected to be observed. For example, other types of characterizing values can also be used, in a similar manner or in the same manner as the thickness discussed below, in determining polishing rate adjustments during polishing processes. Similarly, the polishing rate need not be a rate of change of the thickness, but can be a rate of change of the characterizing value.

For the purpose of the discussion, the thicknesses directly derived from the results of the in-situ measurements are named as derived thicknesses. In the example of optical monitoring, each derived thickness corresponds to a measured spectrum. The name "derived thickness(es)" is not intend to provide any meaning to such thicknesses. Instead, the name is merely chosen to distinguish these thicknesses from other types of thicknesses, e.g., thicknesses obtained from other sources or from additional data processing, discussed further below. Other names can be chosen for the same purpose.

The multiple derived thicknesses for a zone may be different, e.g., due to the actual (or physical) thickness difference at different locations in the same zone, measurement error, and/or data processing error. In some implementations, within error tolerance, a so-called "measured thickness" of a zone in a given rotation of the platen may be calculated based on the multiple derived thicknesses in the given rotation. The measured thickness of a zone in a given rotation can be the average value or a median value of the multiple derived thicknesses in the given rotation. Alternatively, the measured thickness of a zone in a given rotation can be generated by fitting a function, e.g., a polynomial function, e.g., a linear function, to the multiple derived thicknesses from multiple rotations, and calculating the value of the function at the given rotation. When fitting the function, the calculation can be performed using only the derived thickness since the most recent pressure/polishing rate adjustment.

Whichever technique is used to calculate the measured "thickness", over multiple rotations of the platen, for each zone of each substrate, a sequence of measured thicknesses can be obtained over time. In some implementations, which technique to calculate the measured "thickness" can be selected by user input from an operator of the polishing apparatus through a graphical user interface, e.g., a radio button.

Pressure Control Based on the In-Situ Measurements

Generally, a desired thickness profile is to be achieved for each of one or more substrates at the end of a polishing process (or at the endpoint time when the polishing process stops). For each substrate, the desired thickness profile may include the same predetermined thickness for all zones of the substrate 10, or different, predetermined thicknesses for different zones of the substrate 10. When multiple substrates are polished simultaneously, the multiple substrates may have the same desired thickness profile or different desired thickness profiles.

The desired thickness profiles illustrate a relative thickness relationship of all zones of all substrates at the endpoint time. During the polishing process, it is desirable to have the instant actual (or physical) thicknesses of different zones at the same time points to have the same or a similar relative thickness relationship to achieve the closer endpoint conditions. For example, when the desired thickness profiles of multiple substrates show that all zones of all substrates should reach the same thickness at the endpoint time, it would be desirable to keep the instant actual (or physical) thicknesses of all zones to be the same throughout the polishing process. The actual (or physical) thicknesses are generally represented by the derived thicknesses and/or the measured thicknesses. The precision of the representation, which can be affected by factors including the precision in the measurements, the derivations, and the calculations, can affect the precision at which the desired thickness profiles can be reached at the endpoint time.

During the polishing process, measured thicknesses and measured polishing rates of multiple zones can be determined in-situ for each rotation of the platen, based on the in-situ measurements of completed rotation(s). The relationship among the measured thicknesses can be compared with the relative thickness relationship and the actual polishing rates can be adjusted so that the actual (or physical) thicknesses are changed in future rotation(s) to more closely follow the relative thickness relationship. Similar to the actual thicknesses and the measured/derived thicknesses, the actual polishing rates are represented by the measured polishing rates. In one example, the actual polishing rates of certain zones can be changed by changing the pressure of the corresponding chambers and the amount of pressure changes can be derived from the amount of polishing rates to be changed, as explained further below.

In some implementations, one zone of the one or more substrates is selected to be a so-called reference zone. The reference zone can be chosen to be a zone that provides the most reliable in-situ thickness measurement and/or has the most reliable control over the polishing. For example, the reference zone can be a zone from which the largest number of spectra is collected from each rotation of the platen. The reference zone can be chosen by the controller or the computer based on the in-situ measurement data. The measured thickness of the reference zone can be viewed as representing the actual thickness of the reference zone at a relatively high precision. Such a measured thickness provides a reference thickness point for all other zones of the one or more substrates, which can be called control zone(s). For example, based on the measured thickness of the reference zone in a given rotation of the platen, the desired thicknesses of all control zones for the given rotation of the platen can be determined based on their relative thickness relationships to the reference zone.

In some implementations, to keep the measured thickness relationships between the control zones and the reference zone similar to or the same as the thickness relationships illustrated by the desired thickness profile(s) at the endpoint time throughout the polishing process, the controller and/or computer can schedule to adjust the polishing rates of the control zones at a predetermined rate, e.g., every given number of rotations, e.g., every 5 to 50 rotations, or every given number of seconds, e.g., every 3 to 30 seconds. In some ideal situations, the adjustment may be zero at the prescheduled adjustment time. In other implementations, the adjustments can be made at a rate determined in-situ. For example, if the measured thicknesses of different zones are vastly different from the desired thickness relationships, then the controller and/or the computer may decide to make frequent adjustments for the polishing rates.

Figure 4:
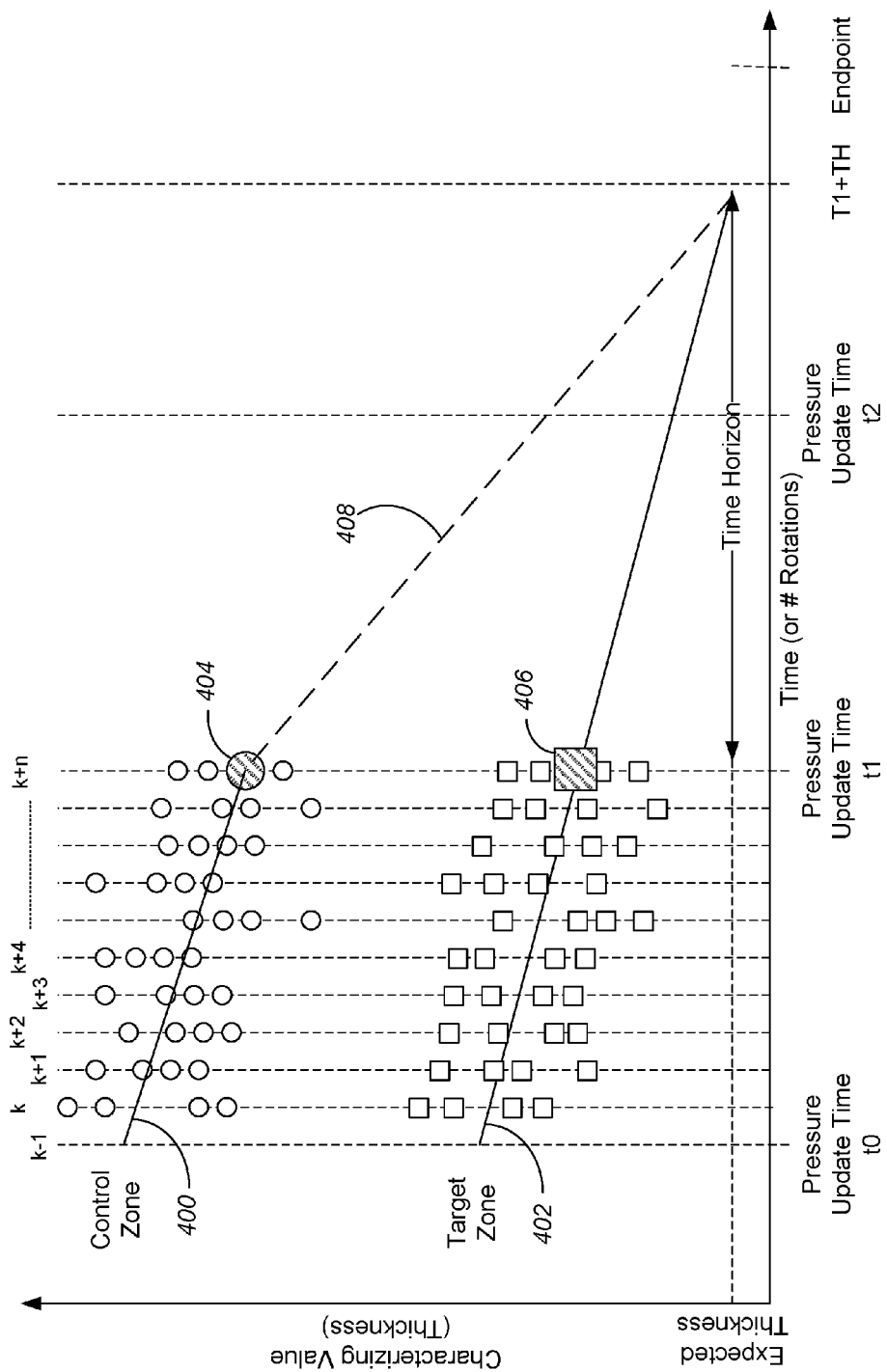
FIG. 4 is a plot of thicknesses derived from in-situ measurements for a control zone and a reference zone.

Referring to FIG. 4, the derived thicknesses (or the thicknesses derived from in-situ measurements, such as optical spectra) for a reference zone and a control zone are plotted to facilitate the visualization of a process for adjusting the chamber pressure and the polishing rate of the control zone. The chamber pressure and the polishing rate of any other control zone can be similarly performed. The controller and/or the computer processing the data may or may not make or display the plot shown in FIG. 4.

In particular, along the time axis (horizontal axis), three predetermined pressure update time $t_0$, $t_1$, and $t_2$ have been marked. The time axis can also be mapped to the number of rotations completed by the platen. The current time point of the polishing process shown in the plot is $t_1$, at which time the platen has completed k+n rotations, (n+1) of which have been completed between the two pressure update time $t_0$ (exclusive) and $t_1$ (inclusive). In the example shown in the plot, n is 9, and a total of 10 rotations have been completed in the time period $t_1$-$t_0$. Of course, n could be a value other than 9, e.g., 5 or more, depending on the rate at which adjustments are performed and the rotation rate of the platen.

The chamber pressure adjustment and polishing rate adjustment for the control zone is to be determined so that during the time period $t_1$ to $t_2$, the control zone is polished at the adjusted polishing rate. Before the pressure update time $t_1$, one or more chamber pressure/polishing rate updates have been performed for the control zone, in a manner similar to the adjustments to be determined and to be made at $t_1$, and after the pressure update time $t_1$, zero or one or more additional pressure updates may be performed, also in a manner similar to the adjustments determined and to be made at $t_1$, until the endpoint time of the polishing process.

The derived thicknesses of the control zone and the reference zone during the n+1 rotations of the platen in the time period $t_1$-$t_0$ are used in determining the measured thicknesses in each rotation, the measured polishing rate in each rotation, the desired polishing rate after $t_1$, the amount of adjustment to be made to the polishing rate, and therefore, the amount of chamber pressure adjustment, for the control zone in the time period $t_2$-$t_1$. For each rotation k, . . . , k+n, the derived thicknesses of the control zone and the reference zone are represented by circles and squares in the plot, respectively. For example, for rotation k, four derived thicknesses are plotted for each of the control zone and the reference zone; for rotation k+1, four derived thicknesses are plotted for the control zone and three derived thicknesses are plotted for the reference zone; and so on.

1. Measured Thicknesses and Polishing Rates

As briefly explained previously, for each zone, the measured thickness in each rotation can be determined as the average or median value of all derived thicknesses in the rotation, or can be a fitted value. A measured polishing rate for each zone can be determined in each rotation using a function that fits the derived thicknesses of each zone.

In some implementations, a polynomial function of known order, e.g., a linear function, can be fit to all derived thicknesses of each zone between the time period $t_0$ to $t_1$. For example, the fitting can be performed using robust line fitting. In some implementations, the function is fit to less than all of the derived thicknesses, e.g., the function can be fit to the median value from each rotation. Where a least squares calculation is used for the fit, this can be termed a "least squares median fit".

Based on the fitted functions, which can be represented as a function $F_{control}(\text{time})$ or $F_{ref}(\text{time})$ for the control zone or the reference zone, a measured polishing rate in the $(k+i)^{th}$ rotation of the platen, where $i=0, \ldots, n$, can be calculated as $$\left.\frac{\partial F_{control}(\text{time})}{\partial \text{time}}\right|_{time=(k+i)\text{rotations of the platen}}$$

and $$\left.\frac{\partial F_{ref}(\text{time})}{\partial \text{time}}\right|_{time=(k+i)\text{rotations of the platen}}$$

for the control zone and for the reference zone, respectively.

Optionally, the measured thickness can be calculated based on the fitted functions. For example, the measured thickness of the $(k+i)^{th}$ rotation is $F_{control}(t=(k+i)$ rotation of the platen) or $F_{ref}(t=(k+i)$ rotation of the platen) for the control zone or the reference zone. However, although the measured polishing rates are determined based on the fitted function, the measured thicknesses do not have to be determined based on the fitted function. Instead, as discussed above, they can be determined as the average or median value of the derived thicknesses in the corresponding rotation of the platen.

In the example shown in FIG. 4, a first-order function, i.e., a line 400, 402, is used to fit each set of thickness data for each zone. The slopes of the lines 400, 402 represent constant polishing rates $r_{control}$ and $r_{ref}$ for the control zone and the reference zone, respectively, during the time period $t_1$-$t_0$. The thickness value of the two lines 400, 402 at each time point corresponding to the k, . . . , or k+n rotation of the platen represents the measured thickness of the respective zones in the corresponding rotation. As an example, the measured thicknesses of the control zone and the reference zone at the k+n rotation of the platen are highlighted in an enlarged circle 404 and an enlarged square 406, respectively. Alternatively, the measured thicknesses for the n+1 rotations can be calculated independently of the lines 400, 402, e.g., as the average or the medium values of the derived thicknesses of the respective rotations.

Generally, any suitable fitting mechanisms can be used to determine the measured thicknesses and measured polishing rates in the multiple rotations between times $t_0$ and $t_1$. In some implementations, the fitting mechanism is chosen based on the noise in the derived thicknesses, which may originate from the noise in the measurement, in the data processing and/or operation of the polishing apparatus. As an example, when the derived thicknesses contain a relatively large amount of noise, the least square fit can be chosen to determine the measured polishing rates and/or the measured thicknesses; when the derived thicknesses contain a relatively small amount of noise, the polynomial fit can be chosen.

In some implementations, which technique to calculate the measured "polishing rate" can be selected by user input from an operator of the polishing apparatus through a graphical user interface, e.g., a radio button.

Figure 5:
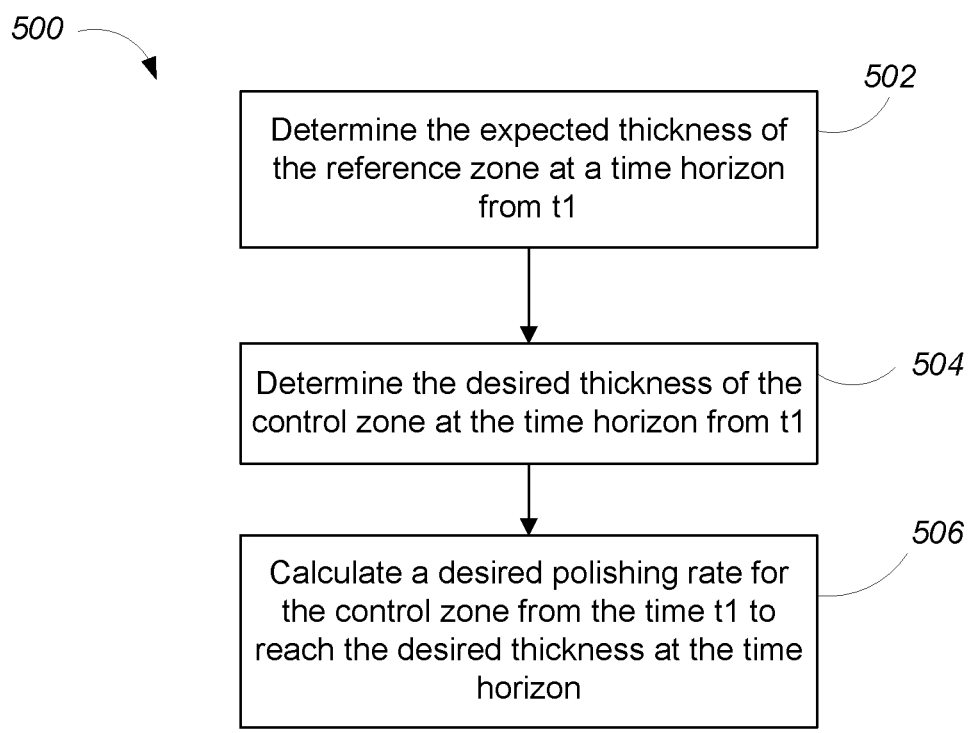
FIGS. 5-7 are flow diagrams showing example processes of calculating a desired polishing rate for a control zone, filtering a measured polishing rate, and filtering a measured thickness for a control zone or a reference zone.

2. Desired Polishing Rates Based on the Measured Thicknesses and Measured Polishing Rates Based on the measured thicknesses and measured polishing rates of each zone, a desired polishing rate for the time period from $t_1$ to $t_2$ can be determined. An example process 500 is shown in FIG. 5, in connection with the example data shown in FIG. 4. Initially, the controller and/or the computer determines (502) the expected thickness of the reference zone at a time horizon (TH) from time $t_1$. The time horizon can be a predetermined length of time during which the actual thickness represented by the measured thickness of the control zone at time $t_1$ is corrected so that at the end of the time horizon (or at time $t_1$+TH), the relationship between the measured thicknesses of the control zone and the reference zone is the same as or similar to the thickness relationship in the desired thickness profile at the endpoint time.

Generally, the time horizon is chosen independently of the total polishing time, endpoint time, and/or the time periods between polishing rate/chamber pressure adjustments (such as $t_1$-$t_0$). However, the time horizon should in general be greater than the period of the pressure updates (e.g., greater than $t_1$-$t_0$) and less than the expected total polishing time. The length of the time horizon can affect how fast the thicknesses of the control zone changes to reach the desired relationship with the thickness of the reference zone. In some implementations, when the polishing process is relatively close to the endpoint time, e.g., the measured thickness of the reference zone at $t_1$ is close to the final desired thickness, and/or the relationship between the measured thicknesses of the two zones at $t_1$ is largely different from the desired relationship, the time horizon is chosen to be relatively short so that the polishing rate adjustment made at $t_1$ can be large and can quickly bring the thickness of the control zone to the desired value relative to the reference zone.

In some implementations, the time horizon is chosen to be as long as or longer than the time periods between the polishing rate/chamber pressure adjustments so that the polishing rate of the control zone is not overly corrected during the time periods. The expected thickness of the reference zone at time $t_1$+TH can be determined by extending the fitted thickness curve 402 or extending the measured polishing rate at time $t_1$ as a constant polishing rate into the time period from $t_1$ to $t_1$+TH. In the example shown in FIG. 4, the line 402 is extended at the constant slope $r_{ref}$ to time $t_1$+TH, and the expected thickness for the reference zone is determined as the vertical value of the curve at that time.

Next, the controller and/or the computer determines (504) the desired thickness of the control zone at the time horizon from time $t_1$. The determination can be made based on the expected thickness of the reference zone at time $t_1$+TH, and the desired thickness relationship between the thicknesses of the two zones at time $t_1$+TH. As discussed above, the desired thickness relationship may be the same as the thickness relationship illustrated in the desired thickness profiles to be achieved at the endpoint time. In the example shown in FIG. 4, the desired thickness of the control zone at time $t_1$+TH is the same as the expected thickness of the reference zone.

The controller and/or the computer then calculates (506) a desired polishing rate for the control zone for the time period TH starting from $t_1$. For simplicity, the desired polishing rate $r_{des}$ can be a constant that equals:

(the desired thickness of the control zone at $t_1$+TH−
the measured thickness of the control zone at
$t_1$)/TH.

In FIG. 4, the slope of the dotted line 408 represents the desired polishing rate $r_{des}$ of the control zone. The amount of polishing rate to be adjusted for the $(k+n+1)^{th}$ rotation after $t_1$ is $\Delta r = r_{des} - r_{t_1}$, where $r_{t_1}$ is the measured polishing rate of the control zone at $t_1$. In this example, the time horizon is chosen to be longer than the time period between polishing rate adjustments. Accordingly, if the control zone performs according to the desired polishing rate and desired thickness reduction during the time period from $t_1$ to $t_2$, at time $t_2$, the measured thickness (or actual thickness) of the control zone is expected to be different from the measured thickness (or actual thickness) of the reference zone. However, the difference between the measured or actual thicknesses of the two zones at time $t_1$ is expected to be smaller than the difference at $t_0$.

At $t_2$, and optionally one or more update times after $t_2$, the polishing rate of the control zone is further adjusted to further reduce the thickness difference between the two zones. The multi-time polishing rate adjustment for the control zone during a polishing process provides a gradual thickness adjustment relative to the reference zone, which may be more reliable and stable than a single adjustment. For example, if the in-situ measurement in a period between two polishing rate adjustments is relatively noisy and inaccurate, the amount of adjustment made to the polishing rate may also be inaccurate. However, such inaccuracy may be corrected by the next polishing rate adjustment, which may be made based on measurements that are relatively accurate.

The polishing rate of the control zone is adjusted by adjusting the pressure of its corresponding chamber. The amount of the pressure adjustment can be determined based on the amount of polishing rate adjustment using a Preston matrix, the details of which are discussed further below.

3. Filtered Thicknesses and Polishing Rates

In some implementations, the measured thicknesses and polishing rates of each zone is filtered, e.g., using a predictive filter so that the filtered thicknesses and polishing rates more accurately represents the actual thicknesses and polishing rates. In general, the effect of the filter is to reduce noise. The output of the filter, i.e., the filtered thickness and filtered polishing rate, at the pressure update time is then used to determine the adjustment for the polishing rate and the pressure.

Figure 6:
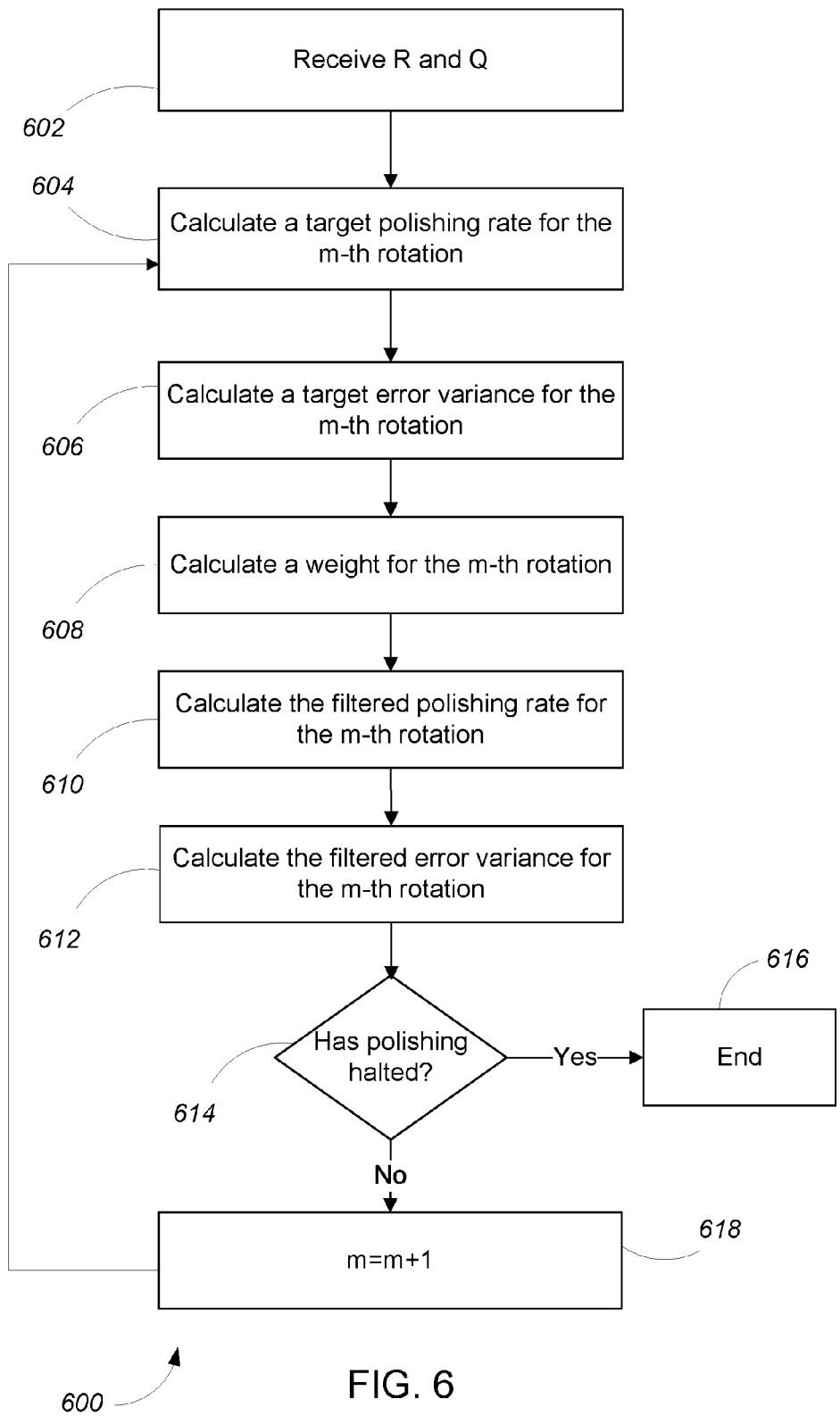

In some implementations, the predictive filter is a Kalman filter. The filtering process takes into consideration a measurement noise, represented by R, a process noise, represented by Q. An example filtering process 600 for the measured polishing rates of a zone is shown in FIG. 6 in connection with the example data shown in FIG. 4. This process can be performed for each zone. This process can be performed at each rotation of the platen.

In particular, to filter the measured polishing rates, e.g., those measured polishing rates for the rotations k, . . . , k+n during the time period from $t_0$ to $t_1$ of FIG. 4, initially, the controller and/or computer receives (602) an estimated process noise value $Q_{rate}$ and an estimated measurement noise $R_{rate}$. A user can estimate the noises and assign a positive value to each noise to represent the degree of the noise. For example, 0 would represent no noise and therefore, high confidence in the corresponding process or measurement, while a large number such as $10^3$ represents very large noise and therefore, low confidence in the corresponding process or measurement.

To perform the filtering, a predicted polishing rate $\overline{rate}_m^-$ for the $m^{th}$ rotation (m is at least 2) is calculated (604) to be:

$$\overline{rate}_m^- = \overline{rate}_{m-1} + \Delta rate,$$

where $\overline{rate}_{m-1}$ is the filtered polishing rate for the $(m-1)^{th}$ rotation, and $\Delta rate$ is the change in polishing rate from the $(m-1)^{th}$ rotation to the $m^{th}$ rotation. In the example of FIG. 4, m=k, . . . , k+n.

Generally, $\Delta rate$ is 0, unless the polishing rate was actually adjusted relative to the immediately previous rotation, e.g., at a pressure update time. For example, assuming the polishing rate is adjusted at the pressure update time to at the transition from the $(k-1)^{th}$ rotation to the $k^{th}$ rotation in FIG. 4, $\Delta rate$ will be non-zero for the $k^{th}$ rotation. Similarly, assuming the polishing rate is adjusted at the pressure update time $t_1$ at the transition from the $(k+n)^{th}$ rotation to the $(k+n+1)^{th}$ rotation in FIG. 4, $\Delta rate$ will be non-zero for the $(k+n+1)^{th}$ rotation.

When the rate is adjusted from one rotation to the next rotation, $\Delta rate$ can be calculated as:

$$\Delta rate = \rho \cdot P \cdot \Delta p,$$

where $\rho$ is the nominal polishing rate for the zone, P is the Preston matrix, which is discussed further below, and $\Delta p$ is the pressure change made in the corresponding chamber.

If there is a filtered polishing rate for the $(m-1)^{th}$ rotation, then $\overline{rate}_{m-1}$ is set to that rate. Otherwise if the filtering process starts at the $m^{th}$ rotation, then $\overline{rate}_{m-1}$ is initialized to be the measured polishing rate for the $(m-1)^{th}$ rotation.

The controller and/or computer also calculates (606) a predicted error covariance $P_m^-$ for the $m^{th}$ rotation:

$$P_m^- = P_{m-1} + Q_{rate},$$

where $P_{m-1}$ is the filtered error covariance for the $(m-1)^{th}$ rotation. If the filtering process starts for the $m^{th}$ rotation without any filtered error covariance for the $(m-1)^{th}$ rotation, then $P_{m-1}$ can be initialized to be a random positive number, such as 1, 10, etc. In some implementations, the initial value for the error covariance can be received from a user. The actual initial value for the error covariance may not have a large effect on the filtered error variance, as the iterative filtering process for multiple rotations reduces the filtered error covariance to a small value regardless of the initial value.

Based on the predicted error covariance for the $m^{th}$ rotation, $P_m^-$, the controller and/or computer calculates (608) a Kalman weight, $K_m$, for the $m^{th}$ rotation:

$$K_m = P_m^- (P_m^- + R_{rate})^{-1}.$$

$K_m$ approaches 1 if the measurement noise $R_{rate}$ is very small relative to the predicted error variance $P_m^-$, or the process noise $Q_{rate}$ is very large relative to the measurement noise $R_{rate}$. If the measurement noise is very large relative to the predicted error variance $P_m^-$, then $K_m$ approaches 0.

The filtered polishing rate $\overline{rate}_m$ for the $m^{th}$ rotation is calculated (610) based on the predicted polishing rate for the $m^{th}$ rotation $\overline{rate}_m^-$ and the measured polishing rate $rate_m$, for the $m^{th}$ rotation as $$\overline{rate}_m = \overline{rate}_m^- + K_m(rate_m - \overline{rate}_m^-).$$

The filtered polishing rate approaches the predicted polishing rate when the measurement noise $R_{rate}$ is very large and the Kalman weight approaches 0. This means that the measured polishing rate $rate_m$ is deemed as unreliable and is mostly not considered in the filtered polishing rate. The filtered polishing rate approaches the measured polishing rate when the process noise $Q_{rate}$ is very large and the Kalman weight approaches 1. This means that the predicted polishing rate is deemed as unreliable and is mostly not considered in the filtered polishing rate. The filtered polishing rate also approaches the measured polishing rate when the measurement noise $R_{rate}$ is very small, meaning that the confidence in the measured polishing rate $rate_m$ is high and the predicted polishing rate can be safely ignored. In general, the filtered polishing rate is a weighted combination of the predicted polishing rate and the measured polishing rate.

The controller and/or computer also determines (612) the filtered error covariance $P_m$ for the $m^{th}$ rotation:

$$P_m = (1-K_m)P_m^-.$$

Since $K_m$ has a value between 0 and 1, $P_m$ is no greater than $P_m^-$.

The controller and/or computer then determines (614) whether polishing has been halted, e.g., the endpoint has been reached. If yes, then the filtering process for the polishing rates ends (616). If no, then m is increased (618) by 1, and the filtering process is repeated starting from the step 604 for the next rotation. For different iterations (or different m values), the same $Q_{rate}$ and/or $R_{rate}$ may be used. In some implementations, $Q_{rate}$ and/or $R_{rate}$ may change over time so that different $Q_{rate}$ and/or $R_{rate}$ are used for at least some of the different iterations in the filtering process.

Figure 7:
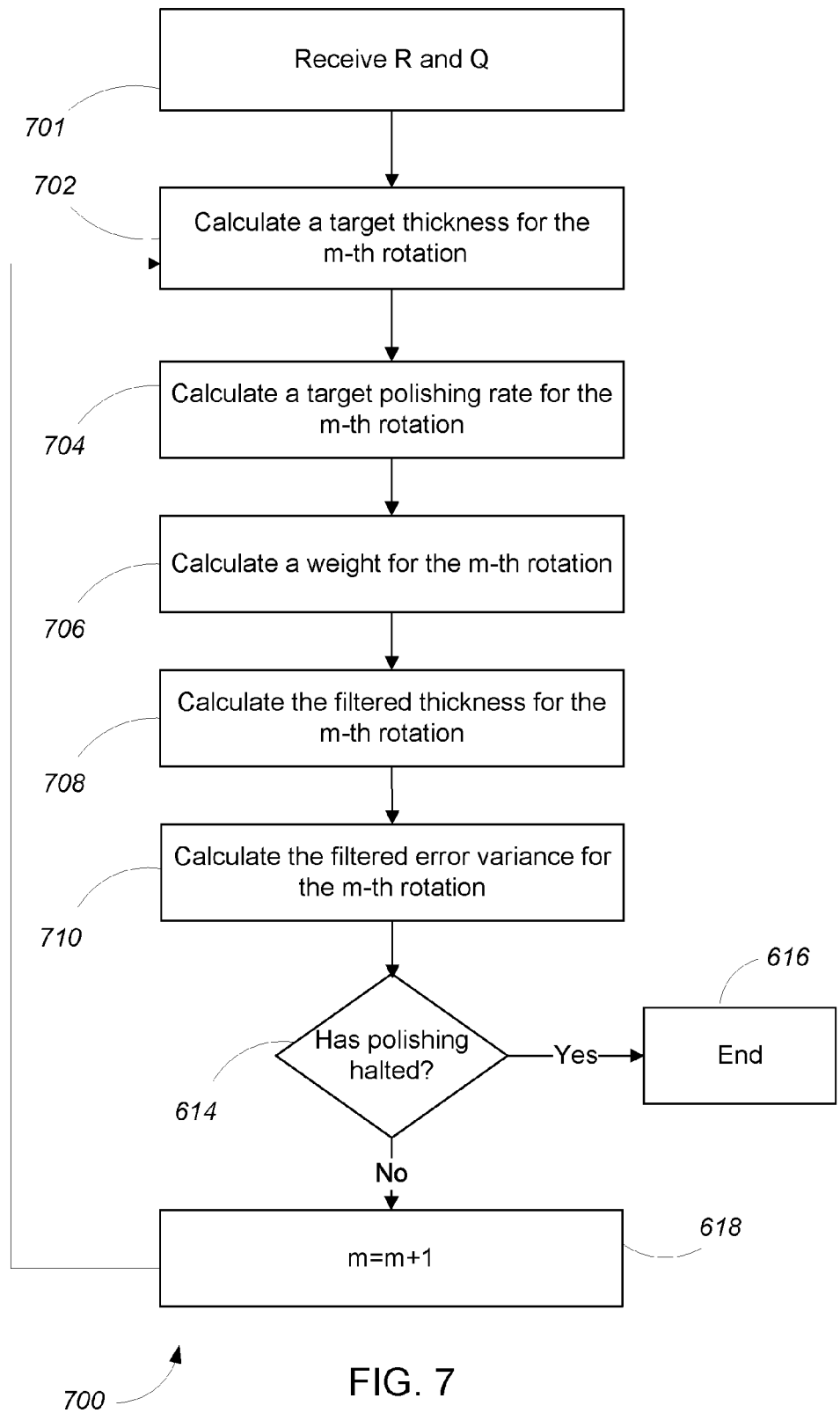

Referring to FIG. 7, in an example filtering process 700, the measured thicknesses of a zone during the time period from $t_0$ to $t_1$ are filtered in connection with the process 600. For example, the filtered polishing rates are used in calculating the filtered thicknesses. This process can be performed for each zone and each rotation of the platen.

In particular, the controller and/or computer receives (701) the process noise $Q_{thickness}$ and measurement noise $R_{thickness}$, and calculates (702) a predicted thickness for the $m^{th}$ rotation:

$$\overline{thickness}_m^- = \overline{thickness}_{m-1} - \Delta t \cdot \overline{rate}_{m-1},$$

where $\overline{thickness}_{m-1}$ is the filtered thickness for the $(m-1)^{th}$ rotation, $\Delta t$ is the period of time for each rotation, and rate is the filtered polishing rate for the $(m-1)^{th}$ rotation. $\Delta t$ and $\overline{rate}_{m-1}$ both have positive values. If the filtered values (thickness or polishing rate) do not exist as the filtering process starts with the $m^{th}$ rotation, $\overline{thickness}_{m-1}$ is initialized to be the measured thickness for the $(m-1)^{th}$ rotation, and rate is initialized to be the measured polishing rate for the $(m-1)^{th}$ rotation.

The values of the noises $R_{thickness}$ and $Q_{thickness}$ received in the step 701 for the thickness can be different from the values of the noises $R_{rate}$ and $Q_{rate}$ received in the step 602 of the process 600 for the polishing rate. Also, different control zones may have different values for the noises R and Q. Similarly to the step 606 of the process 600, the controller and/or computer also calculates (704) a predicted error covariance $P_m^-$ for the $m^{th}$ rotation:

$$P_m^- = P_m + Q_{thickness},$$

where $P_{m-1}$ is the filtered error covariance for the $(m-1)^{th}$ rotation.

Similarly to the step 608 of the process 600, based on the predicted error covariance for the $m^{th}$ rotation, $P_m^-$, the controller and/or computer calculates (706) a Kalman weight, $K_m$, for the $m^{th}$ rotation:

$$K_m = P_m^-(P_m^- + R_{thickness})^{-1}.$$

The filtered thickness $\overline{thickness}_m$ for the $m^{th}$ rotation is calculated (708) based on the predicted thickness for the $m^{th}$ rotation $\overline{thickness}_m^-$ and the measured thickness $\overline{thickness}_m$ for the $m^{th}$ rotation to be:

$$\overline{thickness}_m = \overline{thickness}_m^- + K_m(thickness_m - \overline{thickness}_m^-).$$

Similar to the filtered polishing rate, the filtered thickness approaches the predicted thickness when the measurement noise $R_{thickness}$ is very large and the Kalman weight approaches 0. This means that the measured thickness $thickness_m$ is deemed as unreliable and is mostly not considered in the filtered thickness. The filtered thickness approaches the measured thickness when the process noise $Q_{thickness}$ is very large and the Kalman weight approaches 1. This means that the predicted thickness is deemed as unreliable and is mostly not considered in the filtered thickness. The filtered polishing thickness also approaches the measured polishing thickness when the measurement noise $R_{thickness}$ is very small, meaning that the confidence in the measured polishing thickness $thickness_m$ is high and the predicted thickness can be safely ignored. In other situations, the filtered thickness is a weighted combination of the predicted thickness and the measured thickness.

Similar to the step 612 of the process 600, the controller and/or computer also determines (710) the filtered error variance $P_m$ for the $m^{th}$ rotation:

$$P_m = (1-K_m)P_m^-.$$

The controller and/or computer then determines (712) whether polishing has been halted, e.g., the endpoint has been reached. If yes, then the filtering process for the thicknesses ends (714). If no, then m is increased (716) by 1, and the filtering process is repeated starting from the step 702 for the next rotation. Similar to the process 600, for different iterations (or different m values), the same $Q_{thickness}$ and/or $R_{thickness}$ may be used; or $Q_{thickness}$ and/or $R_{thickness}$ may change over time so that different $Q_{rate}$ and/or $R_{rate}$ are used for at least some of the different iterations in the filtering process.

The processes 600, 700 can be implemented with variations. For example, some of the steps in each process can be implemented in a different order, without being limited by the example flows shown for the processes. Also, the two processes may be combined into one single process in which the measured thicknesses and the measured polishing rates are filtered.

The filtered thicknesses and polishing rates generally can represent the actual thicknesses and polishing rates more accurately than the measured thicknesses and polishing rates. Accordingly, the polishing rate adjustments made based on the filtered thicknesses and polishing rates can have a higher accuracy than those made based on the measured thicknesses and polishing rates for achieving the desired thickness profiles at the endpoint time.

4. Desired Polishing Rates Based on the Filtered Thicknesses and Filtered Polishing Rates Referring again to FIGS. 4 and 5, the process 500 for calculating a desired polishing rate for the control zone in a time period from time $t_1$ to time $t_2$ can be similarly implemented using the filtered thicknesses and filtered polishing rates of the two zones. The discussions made in the section "2. Desired Polishing Rates Based on the Measured Thicknesses and Measured Polishing Rates" are applicable here, except that the filtered thickness(es) and filtered polishing rate(s) are substituted for the "measured thickness(es)" and "measured polishing rate(s)", respectively.

For example, the expected thickness for the reference zone at time $t_1+TH$ can be determined based on the thickness reduction trend found in the filtered thicknesses, instead of in the measured thicknesses. The desired thickness for the control zone at time $t_1+TH$ is accordingly changed. In addition, the desired polishing rate for the control zone in the time period from time $t_1$ to time $t_2$ is calculated as:

(the desired thickness of the control zone at $t_1+TH$ – the filtered thickness of the control zone at $t_1$)/ $TH$.

Furthermore, the amount of polishing rate adjustment to be made for the control zone becomes: $\Delta r = r_{des} - \bar{r}_{t_1}$, where $\bar{r}_{t_1}$ is the filtered polishing rate of the control zone at $t_1$. The so-determined desired polishing rate and polishing rate adjustment can have a higher accuracy than those determined based on measured thicknesses and measured polishing rates.

5. Pressure Adjustment

The controller and/or computer can adjust the pressure of a chamber in the polishing apparatus to adjust the polishing rate of a corresponding control zone at a prescheduled time, e.g., $t_1$ of FIG. 4, to the desired polishing rate. The amount of pressure change can be calculated based on the amount of polishing rate to be adjusted, which can be determined based on filtered thicknesses and filtered polishing rates as discussed above.

In particular, the current pressure p, the pressure change $\Delta \vec{p}$, the current polishing rate r, and the polishing rate change $\Delta \vec{r}$ have the following relationship:

$$\frac{\Delta \vec{r}}{r} = P \frac{\Delta \vec{p}}{p},$$

where P is the Preston matrix. Sometimes the term $$\frac{r}{p}$$

is also called the nominal polishing rate $\rho$, as discussed above.

In the example shown in FIG. 4, the pressure change $\Delta \vec{p}$ to be made for the $(k+n+1)^{th}$ rotation can be calculated as $$\frac{p \Delta \vec{r}}{r} P^{-1},$$

where p is known to the controller and/or computer, $\Delta \vec{r}$ has been determined using the in-situ measurement in the time period $t_0$ to $t_1$, and r is the filtered polishing rate at $t_1$.

The Preston matrix can be empirically determined for the polishing apparatus used for the polishing processes, e.g., the polishing apparatus 100 of FIG. 1. The Preston matrix characterizes the features of the apparatus, such as the polishing head, the polishing pad, etc. In some implementations, one Preston matrix determined for a polishing apparatus can be used for all polishing processes performed by the polishing apparatus, unless the features of the apparatus are significantly changed.

The actual amount of pressure adjusted in the chamber can be used for calculating the predicted polishing rate, as discussed in the step 604 of the process 600, as $\Delta rate = \rho \cdot P \cdot \Delta p$. Here $\Delta p$ is the actual amount of pressure changed. P is the same Preston matrix, and $\rho$ is the nominal polishing rate. In other words, the desired, which is predicted and not necessarily actual, adjustment in the polishing rate of a control zone from the $(m-1)^{th}$ rotation to the $m^{th}$ rotation can be used to determine a desired, which is also predicted and not necessarily actual, adjustment in the corresponding chamber pressure from the $(m-1)^{th}$ rotation to the $m^{th}$ rotation. After the chamber pressure is actually adjusted by the controller or the computer based on the determined desired pressure adjustment, the actual amount of pressure adjustment is in turn used for calculating the predicted and the desired polishing rate in the $m^{th}$ rotation.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Although the description above has focused on control of a chemical mechanical polishing system, the in-sequence metrology station can be applicable to other types of substrate processing systems, e.g., etching or deposition systems.

Embodiments, such as the filtering processes, of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. Alternatively or in addition, the program instructions can be encoded on an artificially generated propagated signal, e.g., a computer-generated electrical, optical, or electromagnetic signal, that is generated to encode information for transmission to suitable receiver apparatus for execution by a data processing apparatus. The computer storage medium can be a computer-readable storage device, a computer-readable storage substrate, a random or serial access memory device, or a combination of one or more of them.

The term "data processing apparatus" refers to data processing hardware and encompasses all kinds of apparatus, devices, and machines for processing data, including by way of example a programmable digital processor, a digital computer, or multiple digital processors or computers. The apparatus can also be or further include special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit). For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Control of the various systems and processes described in this specification, or portions of them, can be implemented in a computer program product that includes instructions that are stored on one or more non-transitory computer-readable storage media, and that are executable on one or more processing devices. The systems described in this specification, or portions of them, can be implemented as an apparatus, method, or electronic system that may include one or more processing devices and memory to store executable instructions to perform the operations described in this specification.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

Other embodiments are within the scope of the following claims.

What is claimed is:

1. A method of controlling polishing, comprising:
polishing a region of a substrate at a first polishing rate;
measuring a sequence of characterizing values over time for the region of the substrate during polishing with an in-situ monitoring system, the characterizing values depending on a thickness of a layer undergoing polishing in the region;
for each of a plurality of adjustment times at which a polishing rate is adjusted prior to a polishing endpoint time, determining a polishing rate adjustment for the region of the substrate based on the sequence of characterizing values, wherein the plurality of adjustment times include a first adjustment time and an immediately subsequent second adjustment time separated by a first time period, wherein the first time period spans a plurality of characterizing values from the sequence of characterizing values, wherein for at least one respective adjustment time of the plurality of adjustment times determining the polishing rate adjustment comprises calculating a desired polishing rate to bring a projected characterizing value to a desired value at a projected time that occurs at a second time period after the respective adjustment time, wherein the polishing rate adjustment is calculated from the first polishing rate and the desired polishing rate, wherein the second time period is greater than the first time period, and wherein the projected time is before the polishing endpoint time; and adjusting a polishing parameter to polish the substrate at a second polishing rate, the second polishing rate being the first polishing rate as adjusted by the polishing rate adjustment.

2. The method of claim 1, wherein determining the polishing rate adjustment comprises calculating a desired polishing rate adjustment from the desired polishing rate and the first polishing rate, and comparing the desired polishing rate adjustment to a threshold.

3. The method of claim 2, comprising determining that the desired polishing rate adjustment exceeds the threshold, and setting the polishing rate adjustment equal to the threshold.

4. The method of claim 2, comprising determining that the desired polishing rate adjustment does not exceeds the threshold, and setting the polishing rate adjustment equal to the desired polishing rate adjustment.

5. The method of claim 1, wherein the desired value is a projected value for a reference region of the substrate.

6. The method of claim 1, wherein the plurality of adjustment times occur at a fixed frequency.

7. The method of claim 6, wherein the fixed frequency is once per 5 to 50 rotations of a platen supporting a polishing pad that polishes the substrate.

8. The method of claim 6, wherein the fixed frequency is once per 3 to 30 seconds.

9. The method of claim 1, wherein the second time period at least twice the first time period.

10. The method of claim 1, comprising measuring a sequence of spectra reflected from the region of the substrate during polishing with the in-situ monitoring system to provide a sequence of measured spectra, and calculating a characterizing value from each measured spectrum from the sequence of measured spectra to generate the sequence of characterizing values.

11. The method of claim 10, wherein calculating the characterizing value from each measured spectrum comprises identifying for the measured spectrum a matching reference spectrum from a library of reference spectra and determining the characterizing value associated with the matching reference spectrum.

12. The method of claim 10, wherein calculating the characterizing value from each measured spectrum comprises fitting an optical model to the measured spectrum and determining the characterizing value from a parameter of the model.

13. The method of claim 1, wherein the in-situ monitoring system comprises an eddy current monitoring system.

14. The method of claim 1, wherein the second time period is a predetermined length of time.

15. The method of claim 1, wherein determining the polishing rate adjustment for the region of the substrate for the respective adjustment time comprises determining a measured polishing rate for the region for the respective adjustment time.

16. The method of claim 1, wherein determining the measured polishing rate for the region comprises fitting a function to a portion of the sequence of characterizing values between the respective adjustment time and an immediately previous adjustment time from the plurality of adjustment times.

* * * * *